United States Patent
Chen et al.

(10) Patent No.: US 7,446,400 B2
(45) Date of Patent: Nov. 4, 2008

(54) CHIP PACKAGE STRUCTURE AND FABRICATING METHOD THEREOF

(75) Inventors: Ya-Chi Chen, Tainan County (TW); Chun-Ying Lin, Tainan County (TW); Yu-Ren Chen, Tainan County (TW); I-Hsin Mao, Tainan County (TW)

(73) Assignees: ChipMOS Technologies, Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 94 days.

(21) Appl. No.: 11/470,494

(22) Filed: Sep. 6, 2006

(65) Prior Publication Data

US 2008/0006917 A1    Jan. 10, 2008

(30) Foreign Application Priority Data

Jul. 5, 2006    (TW) ............... 95124446 A

(51) Int. Cl.
H01L 23/495 (2006.01)
H01L 23/04 (2006.01)
H01L 23/48 (2006.01)
H01L 23/50 (2006.01)

(52) U.S. Cl. ............... 257/673; 257/E23.039; 257/E23.031; 257/666; 257/669; 257/670; 257/672; 257/674; 257/698; 257/691; 257/692

(58) Field of Classification Search ............... 257/673, 257/E23.039, E23.031, 691, 692, 666, 669, 257/678, 670, 672, 674, 698, 671
See application file for complete search history.

(56) References Cited

U.S. PATENT DOCUMENTS

| | | | | |
|---|---|---|---|---|
| 6,008,073 A * | 12/1999 | King et al. | ............ | 438/123 |
| 6,437,447 B1 * | 8/2002 | Huang et al. | ............ | 257/777 |
| 6,555,918 B2 * | 4/2003 | Masuda et al. | ............ | 257/777 |
| 6,787,889 B2 * | 9/2004 | Schoenfeld | ............ | 257/666 |
| 2001/0001504 A1 * | 5/2001 | Sugiyama et al. | ............ | 257/666 |
| 2002/0195691 A1 * | 12/2002 | Schoenfeld | ............ | 257/666 |
| 2003/0021990 A1 * | 1/2003 | Tanabe et al. | ............ | 428/343 |
| 2003/0127713 A1 * | 7/2003 | Schoenfeld | ............ | 257/666 |
| 2003/0153134 A1 * | 8/2003 | Kawata et al. | ............ | 438/123 |
| 2005/0146058 A1 * | 7/2005 | Danno | ............ | 257/796 |
| 2006/0186528 A1 * | 8/2006 | Sasaki et al. | ............ | 257/690 |
| 2007/0004092 A1 * | 1/2007 | Suzuki et al. | ............ | 438/123 |
| 2008/0012118 A1 * | 1/2008 | Danno | ............ | 257/693 |
| 2008/0017958 A1 * | 1/2008 | Wu et al. | ............ | 257/666 |

FOREIGN PATENT DOCUMENTS

JP    6-252328    *    9/1994

* cited by examiner

*Primary Examiner*—Alexander O Williams
(74) *Attorney, Agent, or Firm*—J.C. Patents

(57) ABSTRACT

A chip package structure including a chip, a lead frame, first bonding wires and second bonding wires is provided. The chip has an active surface, first bonding pads and second bonding pads, wherein the first bonding pads and the second bonding pads are disposed on the active surface. The chip is fixed below the lead frame, and the lead frame includes inner leads and bus bars. The inner leads and the bus bars are disposed above the active surface of the chip, and the bus bars are located between the inner leads and the corresponding first bonding pads. The first bonding wires respectively connect the first bonding pads and the bus bars. The second bonding wires respectively connect the bus bars and a part of the inner leads. The third bonding wires respectively connect the second bonding pads and the other of the inner leads.

8 Claims, 8 Drawing Sheets

CHIP PACKAGE STRUCTURE AND FABRICATING METHOD THEREOF

CROSS-REFERENCE TO RELATED APPLICATION

This application claims the priority benefit of Taiwan application serial no. 95124446, filed on Jul. 5, 2006. All disclosure of the Taiwan application is incorporated herein by reference.

BACKGROUND OF THE INVENTION

1. Field of the Invention

The present invention relates to a semiconductor device and a fabricating method thereof, and more particularly, to a chip package structure and fabricating method thereof.

2. Description of Related Art

In the semiconductor industry, the fabrication of an integrated circuit (IC) is mainly divided into three stages: IC design, IC process and IC package.

During the fabrication of ICs, a chip is made by the steps of wafer fabricating, IC forming, wafer sawing and so on. The wafer has an active surface, which generally refers to a surface having active devices formed thereon. When the IC on the wafer is finished, a plurality of bonding pads is further disposed on the active surface of the wafer, such that the chip formed by wafer sawing is electrically connected to a carrier outward via the bonding pads. The carrier is, for example, a lead frame or a package substrate. The chip can be electrically connected to the carrier by means of wire bonding or flip-chip bonding, such that the bonding pads of the chip are electrically connected to the contacts of the carrier, thus forming a chip package structure.

FIG. 1A is a schematic sectional side view of a conventional chip package structure. FIG. 1B is a schematic top view of a portion of the members of the chip package structure in FIG. 1A. Referring to FIGS. 1A and 1B, a conventional chip package structure 100 includes a chip 110, a lead frame 120, a plurality of first bonding wires 130, a plurality of second bonding wires 140, a plurality of third bonding wires 150 and an encapsulant 160. The chip 110 has an active surface 112 and a plurality of first bonding pads 114 and second bonding pads 116 disposed on the active surface 112. The chip 110 is fixed below the lead frame 120, and the lead frame 120 includes a plurality of inner leads 122 and a bus bar 124. The inner leads 122 and the bus bar 124 are located above the active surface 112 of the chip 110, and the bus bar 124 is in an annular shape.

Referring to FIG. 1B, as the first bonding pads 114 of the chip 110 have the same electric potential, and the first bonding pads 114 are, for example, ground bonding pads or power supply bonding pads, thus the first bonding pads 114 having the same electric potential are respectively connected to the bus bar 124 via the first bonding wires 130, and the bus bar 124 is further connected to the corresponding portion of the inner leads 122 via the second bonding wires 140. However, the second bonding pads 116 of the chip 110 for transmitting signals (for example, signal bonding pads with ever-changing electric potentials) must be connected to other corresponding inner leads 122 via the third bonding wires 150, and the third bonding wires 150 usually have to cross a portion of the first bonding wires 130, a portion of the second bonding wires 140 and the bus bar 124. Therefore, the third bonding wires 150 are quite long, which is likely to make the third bonding wires 150 collapsed, thereby causing electric shorts. Or, the third bonding wires 150 may be collapsed during molding or being pulled apart by the injected encapsulant, thus causing electric broken circuits.

SUMMARY OF THE INVENTION

An objective of the present invention is to provide a chip package structure, so as to reduce the possibility of the collapse of the bonding wires.

Another objective of the present invention is to provide a method of fabricating the chip package structure, so as to improve the product yield of the chip package structure.

To achieve the above or other objectives, the present invention provides a chip package structure, which includes a chip, a lead frame, a plurality of first bonding wires, a plurality of second bonding wires and a plurality of third bonding wires. The chip has an active surface, a plurality of first bonding pads and a plurality of second bonding pads, wherein the first bonding pads and the second bonding pads are disposed on the active surface. The chip is fixed below the lead frame, and the lead frame includes a plurality of inner leads and a plurality of bus bars. The inner leads and the bus bars are disposed above the active surface of the chip, and the bus bars are located between the inner leads and the corresponding first bonding pads. The first bonding wires respectively connect the first bonding pads and the bus bars. The second bonding wires respectively connect the bus bars and a part of the inner leads. The third bonding wires respectively connect the second bonding pads and the other of the inner leads.

In an embodiment of the present invention, the chip package structure further includes an encapsulant, so as to cover the active surface, the inner leads, the bus bars, the first bonding wires, the second bonding wires and the third bonding wires.

To achieve the above or other objectives, the present invention provides a chip package structure, which includes a chip, a lead frame, a plurality of first bonding wires, a plurality of second bonding wires and a plurality of third bonding wires. The chip has an active surface, a plurality of first bonding pads and a plurality of second bonding pads, wherein the first bonding pads and the second bonding pads are disposed on the active surface. The lead frame includes a die pad, a plurality of inner leads and a plurality of bus bars. The chip is disposed on the die pad, and the active surface is away from the die pad. The bus bars are located between the die pad and the inner leads, and the bus bars are located at the outer region of the corners of the die pad. The first bonding wires respectively connect the first bonding pads and the bus bars. The second bonding wires respectively connect the bus bars and a part of the inner leads. The third bonding wires respectively connect the second bonding pads and the other of the inner leads.

In an embodiment of the present invention, the chip package structure further includes an encapsulant, so as to cover the active surface, the die pad, the inner leads, the bus bars, the first bonding wires, the second bonding wires and the third bonding wires.

To achieve the above or other objectives, the present invention provides a method of fabricating the chip package structure, which includes the following steps. First, a lead frame including a plurality of inner leads and a plurality of bus bars is provided. Next, a chip is provided. The chip has an active surface, a plurality of first bonding pads and a plurality of second bonding pads, wherein the first bonding pads and the second bonding pads are disposed on the active surface. Then, the chip is fixed below the lead frame, so that the inner leads and the bus bars are disposed above the active surface of the chip, and the bus bars are located between the inner leads and the corresponding first bonding pads. Afterward, a plurality of first bonding wires is formed to respectively connect the first bonding pads and the bus bars. A plurality of second bonding wires is then formed to respectively connect the bus bars and a part of the inner leads. A plurality of third bonding wires is then formed to respectively connect the second bonding pads and the other of the inner leads.

In an embodiment of the present invention, the above method of fabricating the chip package structure further includes forming an encapsulant for covering the active surface, the inner leads, the bus bars, the first bonding wires, the second bonding wires and the third bonding wires.

To achieve the above or other objectives, the present invention provides a method of fabricating the chip package structure, which includes the following steps. First, a lead frame including a die pad, a plurality of inner leads and a plurality of bus bars is provided. The bus bars are disposed between the die pad and the inner leads, and the bus bars are located at the outer region of the corners of the die pad. Next, a chip is provided. The chip has an active surface, a plurality of first bonding pads and a plurality of second bonding pads, wherein the first bonding pads and the second bonding pads are disposed on the active surface. Next, the chip is fixed on the die pad, wherein the active surface is away from the die pad. Afterward, a plurality of first bonding wires is formed to respectively connect the first bonding pads and the bus bars. A plurality of second bonding wires is then formed to respectively connect the bus bars and a part of the inner leads. A plurality of third bonding wires is then formed to respectively connect the second bonding pads and the other of the inner leads.

In an embodiment of the present invention, the above method of fabricating the chip package structure further includes forming an encapsulant for covering the active surface, the die pad, the inner leads, the bus bars, the first bonding wires, the second bonding wires and the third bonding wires.

In summary, according to the present invention, the bus bars are segmented, and the first bonding pads are used as ground bonding pads, power supply bonding pads or signal bonding pads. As a result, the number of the first bonding pads used as transfer points for electrically connecting the bus bars can be increased, and the types (ground, power supply and signal bonding pads) can be various. Therefore, the quantity of the third bonding wires directly connecting the second bonding pads and the other of the inner leads can be reduced, thereby solving the existing drawback of the conventional chip package structure and improving the product yield of the chip package structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The First Embodiment

Figure 2A:
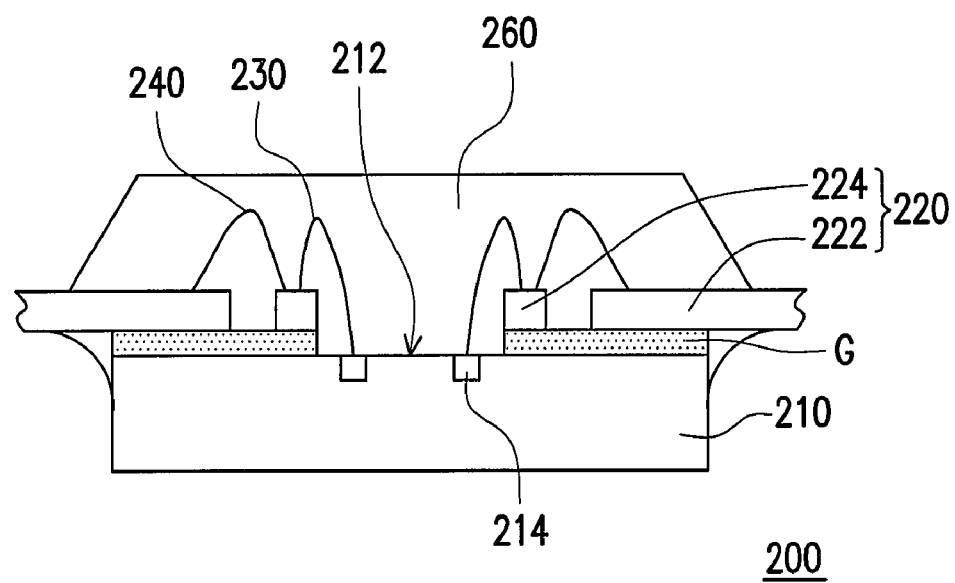
FIG. 2A is a schematic sectional side view of a chip package structure according to the first embodiment of the present invention.
Figure 2B:
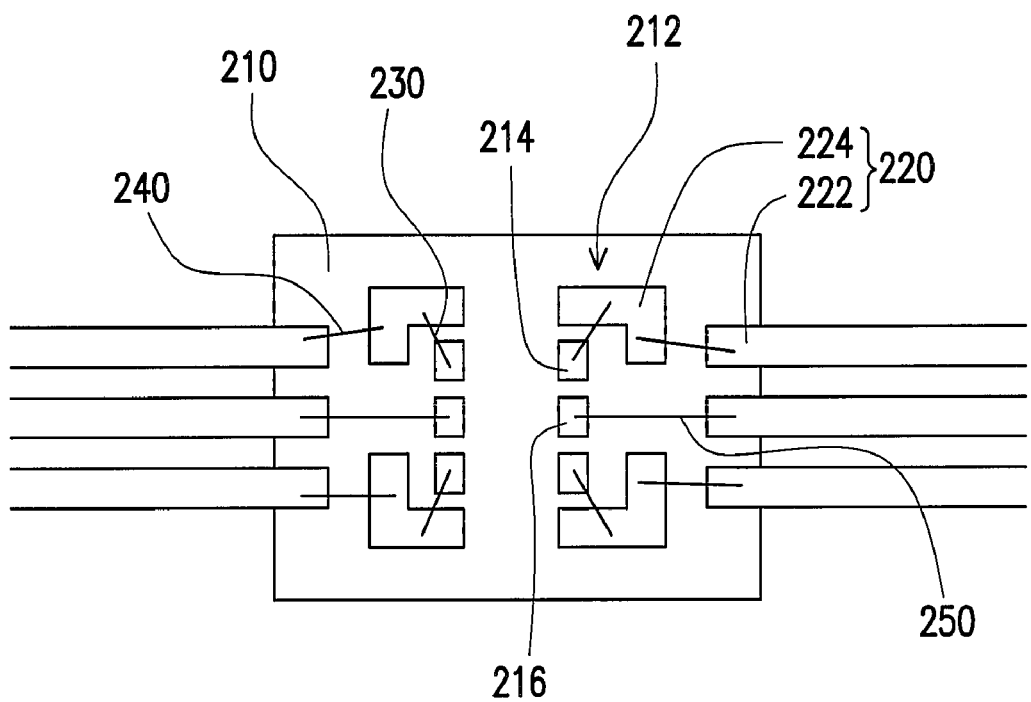
FIG. 2B is a schematic top view of a portion of the members of the chip package structure in FIG. 2A.

FIG. 2A is a schematic sectional side view of a chip package structure according to the first embodiment of the present invention. FIG. 2B is a schematic top view of the chip package structure in FIG. 2A. Referring to FIGS. 2A and 2B, a chip package structure 200 of the first embodiment includes a chip 210, a lead frame 220, a plurality of first bonding wires 230, a plurality of second bonding wires 240 and a plurality of third bonding wires 250. The chip 210 has an active surface 222 and a plurality of first bonding pads 214 and a plurality of second bonding pads 216. The first bonding pads 214 and the second bonding pads 216 are disposed on the active surface 212, and the first bonding pads 214 can be ground bonding pads, power supply bonding pads or signal bonding pads.

In addition, the chip 210 can be fixed below the lead frame 220 by a adhesive G, and the lead frame 220 includes a plurality of inner leads 222 and a plurality of bus bars 224. The inner leads 222 and the bus bars 224 are disposed above the active surface 212 of the chip 210, and the bus bars 224 are located between the inner leads 222 and the corresponding first bonding pads 214. Further, the first bonding wires 230 respectively connect the first bonding pads 214 and the bus bars 224. The second bonding wires 240 respectively connect the bus bars 224 and a part of the inner leads 222. The third bonding wires 250 respectively connect the second bonding pads 216 and the other of the inner leads 222. As shown in FIG. 2B, the length of each of the first bonding wires 230 or the length of each of the second bonding wires 240 is shorter than the length of each of the third bonding wires 250.

In the first embodiment, the chip package structure 200 further includes an encapsulant 260. The encapsulant 260 covers the active surface 212, the inner leads 222, the bus bars 224, the first bonding wires 230, the second bonding wires 240 and the third bonding wires 250.

Figure 1A:
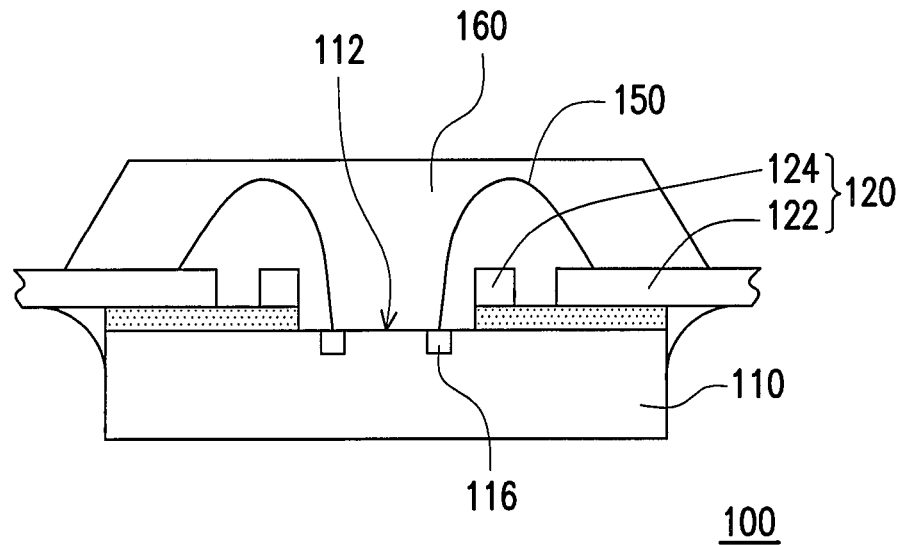
FIG. 1A is a schematic sectional side view of a conventional chip package structure.
Figure 1B:
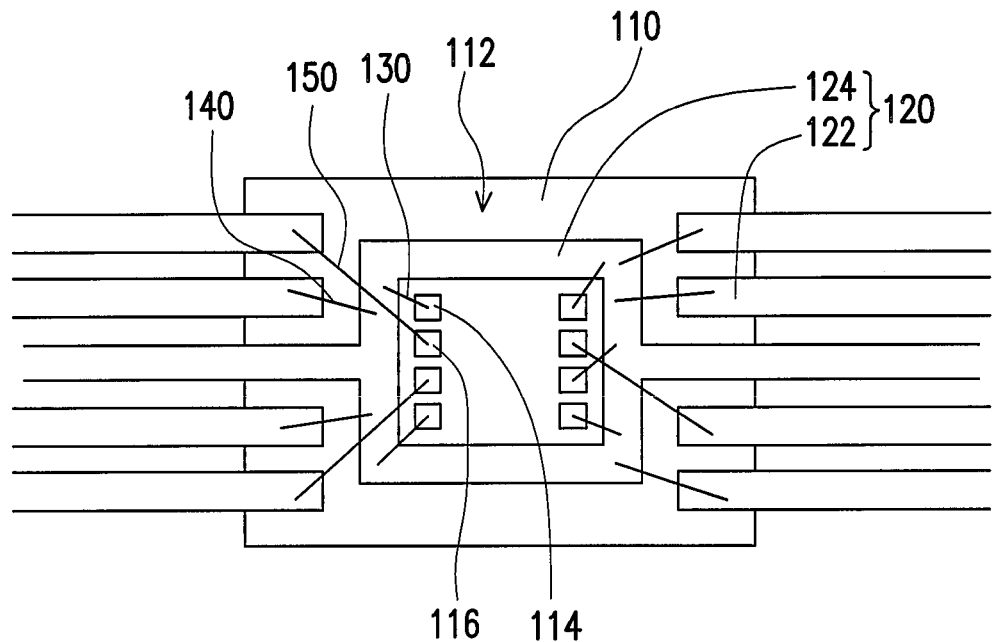
FIG. 1B is a schematic top view of a portion of the members of the chip package structure in FIG. 1A.

It should be noted that, compared with the conventional chip package structure 100 (shown in FIGS. 1A and 1B), because the first bonding pads 214 of the chip package structure 200 of the first embodiment are used as ground bonding pads, power supply bonding pads or signal bonding pads, and the bus bars 224 are segmented, therefore, the number of the first bonding pads 214 used as transfer points for electrically connecting the first bonding pads 214 (ground bonding pads, power supply bonding pads or signal bonding pads) can be increased. Therefore, the quantity of the third bonding wires 250 directly connecting the second bonding pads 216 and the other of the inner leads 222 is reduced, thereby solving the existing drawback of the conventional chip package structure 100 and improving the product yield of the chip package structure 200.

Figure 3A:
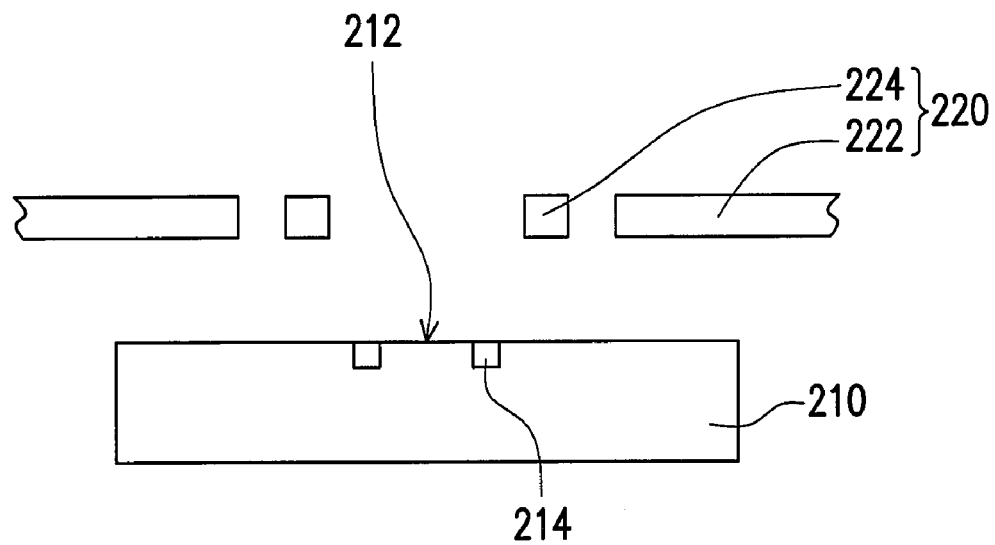
FIGS. 3A to 3E are schematic views of the method of fabricating the chip package structure according to the first embodiment of the present invention.
Figure 3B:
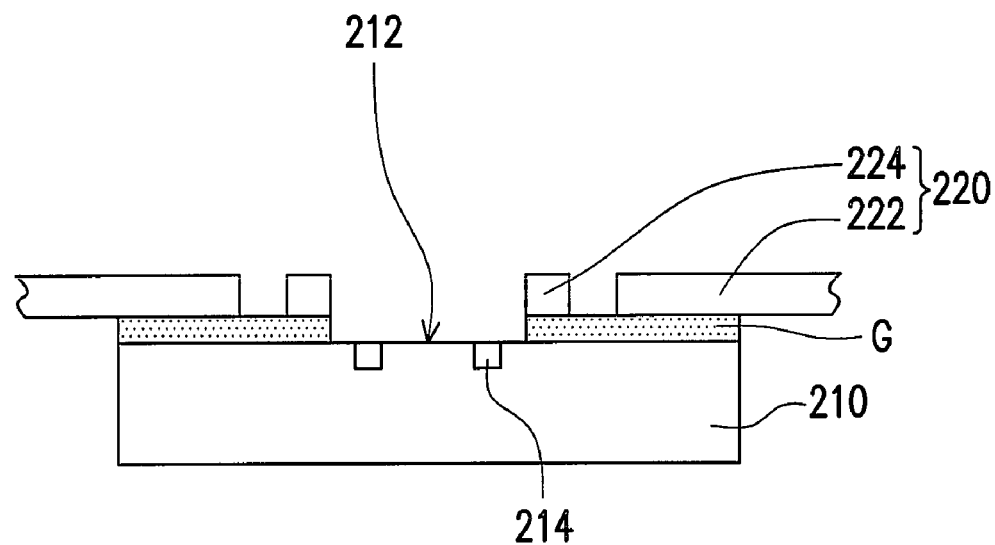

The method of fabricating the chip package structure 200 in the first embodiment is illustrated below. FIGS. 3A to 3E are schematic views of the method of fabricating the chip package structure according to the first embodiment of the present invention. Please note that, for a clearer description, FIG. 3D illustrates a top view while the other figures are schematic sectional side views.

The method of fabricating the chip package structure 200 of the first embodiment includes the following steps. First, referring to FIG. 3A, a lead frame 220 including a plurality of inner leads 222 and a plurality of bus bars 224 is provided. Next, a chip 210 is provided. The chip 210 has an active surface 212, a plurality of first bonding pads 214 and a plurality of second bonding pads 216 (as shown in FIG. 3D), wherein the first bonding pads 214 and the second bonding pads 216 are disposed on the active surface 212.

Next, referring to FIG. 3B, the chip 210 is fixed below the lead frame 220 by a adhesive G, such that the inner leads 222 and the bus bars 224 are located above the active surface 212 of the chip 210, and the bus bars 224 are located between the inner leads 222 and the corresponding first bonding pads 214 (see FIG. 3D).

Figure 3C:
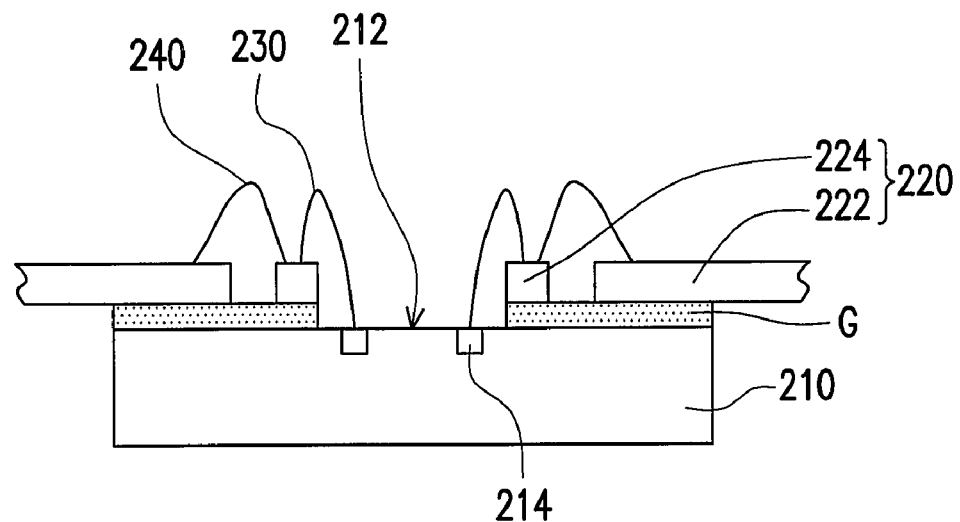
Figure 3D:
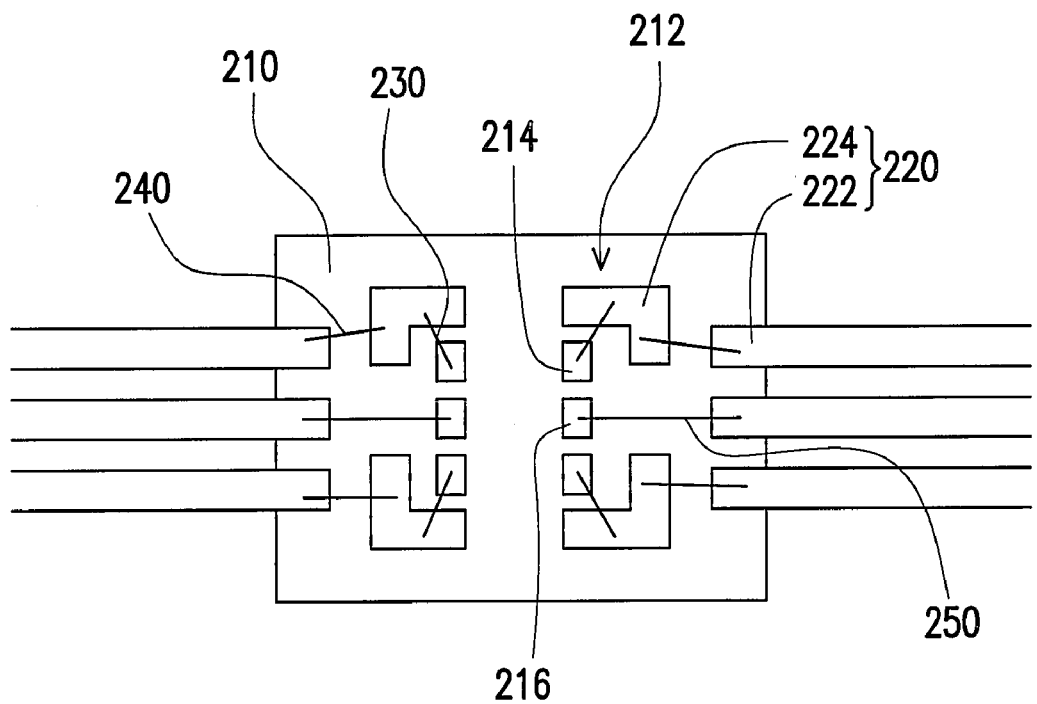

Afterward, referring to FIG. 3C, a wire bonding process is performed to form a plurality of first bonding wires 230, so as to respectively connect the chip bonding pads 214 and the bus bars 224. A plurality of second bonding wires 240 is then formed to respectively connect the bus bars 224 and a part of the inner leads 222. Continuing to FIG. 3D, a plurality of third bonding wires 250 is then formed to respectively connect the second bonding pads 216 and the other of the inner leads 222.

Figure 3E:
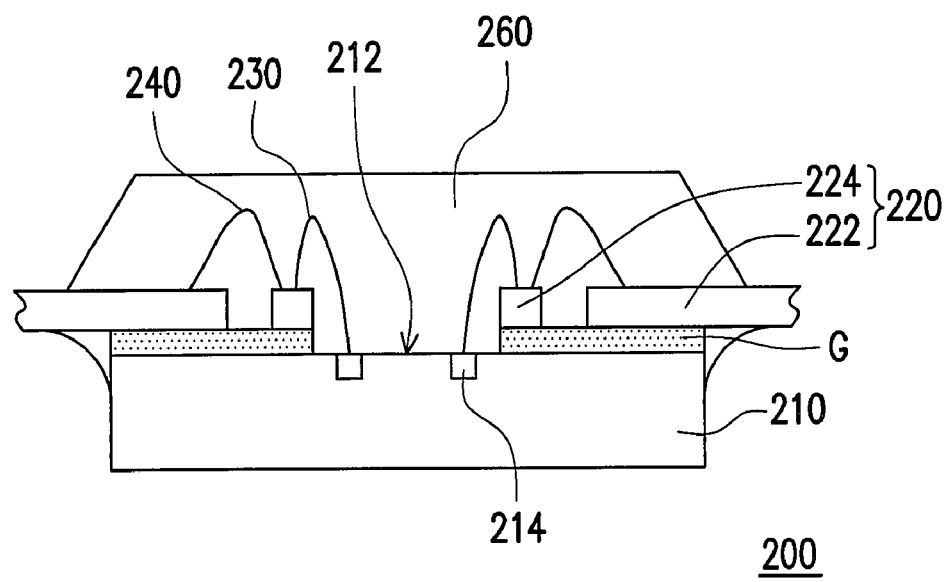

Referring to FIG. 3E, in the first embodiment, the method of fabricating the chip package structure 200 further includes forming an encapsulant 260 to cover the active surface 212, the inner leads 222, the bus bars 224, the first bonding wires 230, the second bonding wires 240 and the third bonding wires 250. The chip package structure 200 of the first embodiment is achieved through the above steps. It should be emphasized that, as the quantity of the third bonding wires 250 directly connecting to the second bonding pads 216 and the other of the inner leads 222 is reduced, the possibility of electric shorts caused by the collapse of the third bonding wires 250 is reduced. Or, the possibility of electric broken circuits caused by the breaking of the third bonding wires 150 being pulled apart by the encapsulant 260 during the molding process is reduced, thereby improving the product yield of the chip package structure 200 of the first embodiment.

The Second Embodiment

Figure 4A:
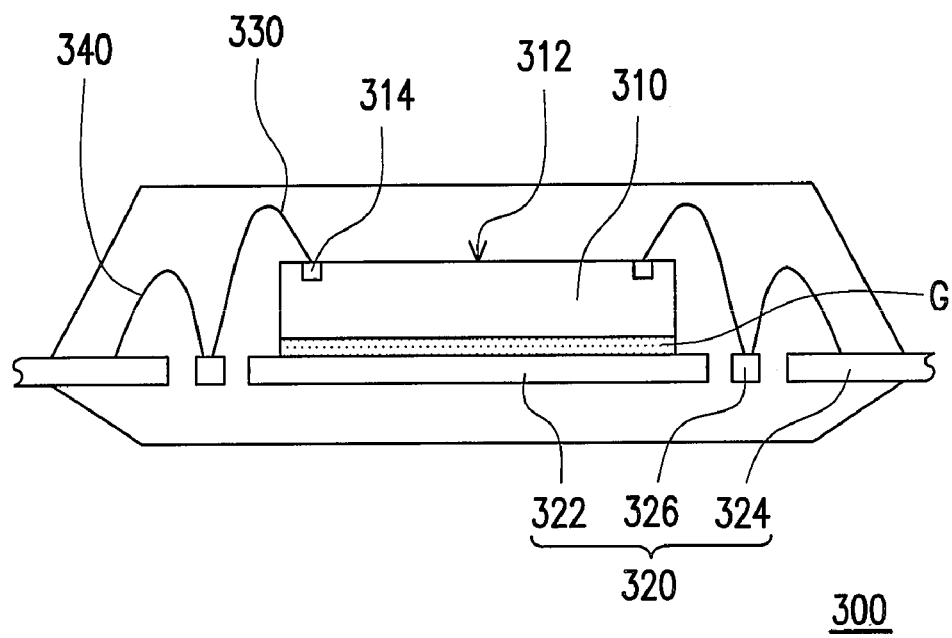
FIG. 4A is a schematic sectional side view of a chip package structure according to the second embodiment of the present invention.
Figure 4B:
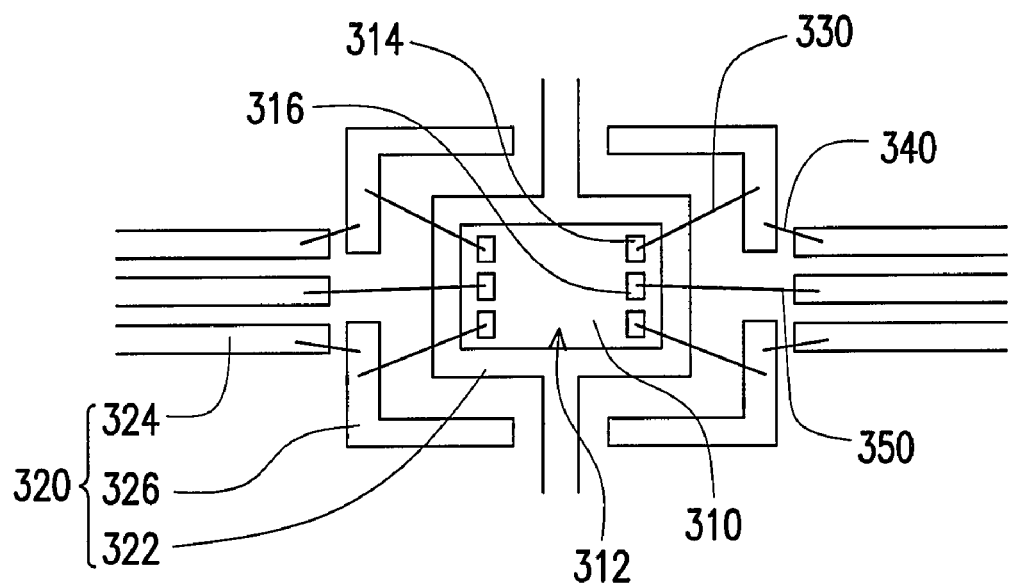
FIG. 4B is a schematic top view of a portion of the members of the chip package structure in FIG. 4A.

FIG. 4A is a schematic sectional side view of a chip package structure according to the second embodiment of the present invention. FIG. 4B is a schematic top view of a portion of the members of the chip package structure in FIG. 4A. Referring to FIGS. 4A and 4B, the main difference between the chip package structure 300 of the second embodiment and the chip package structure 200 of the first embodiment is that: a lead frame 320 of the chip package structure 300 includes a die pad 322, a plurality of inner leads 324 and a plurality of bus bars 326. The chip 310 is disposed on the die pad 322, and the active surface 312 is away from the die pad 322. In other words, as for the relative position in FIG. 4A, the active surface 312 of the chip 310 faces upward. In addition, the bus bars 326 are disposed between the die pad 322 and the inner leads 324, and the bus bars 326 are located at the outer region of the corners of the die pad 322.

The method of fabricating the chip package structure 300 according to the second embodiment is illustrated below. FIGS. 5A to 5E are schematic views of the method of fabricating the chip package structure according to the second embodiment of the present invention. Please note that, for a clearer description, FIG. 5D illustrates a top view while the other figures are schematic sectional side views.

The method of fabricating the chip package structure 300 of the second embodiment includes the following steps. First, referring to FIG. 5A, a lead frame 320 including a die pad 322, a plurality of inner leads 324 and a plurality of bus bars 326 is provided. The bus bars 326 are disposed between the die pad 322 and the inner leads 324, and the bus bars 326 are located at the outer region of the corners of the die pad 322 (see FIG. 5D).

Next, referring to FIG. 5A again, a chip 310 having an active surface 222, a plurality of first bonding pads 314 and a plurality of second bonding pads 316 is provided (as shown in FIG. 5D). The first bonding pads 314 and the second bonding pads 316 are disposed on the active surface 312, and the first bonding pads 314 can be used as ground bonding pads, power supply bonding pads or signal bonding pads. Then, referring to FIG. 5B, the chip 310 can be fixed on the die pad 322 by a adhesive G, and the active surface 312 is away from the die pad 322.

Figure 5A:
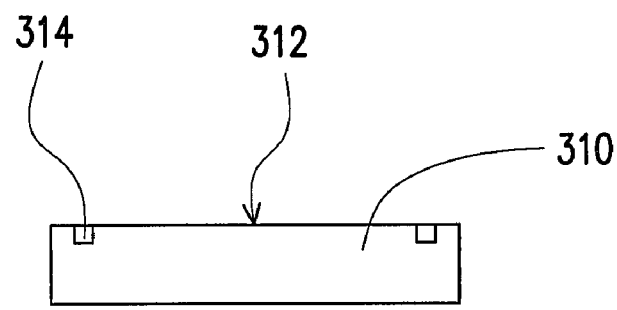
FIGS. 5A to 5E are schematic views of the method of fabricating the chip package structure according to the second embodiment of the present invention.
Figure 5A:
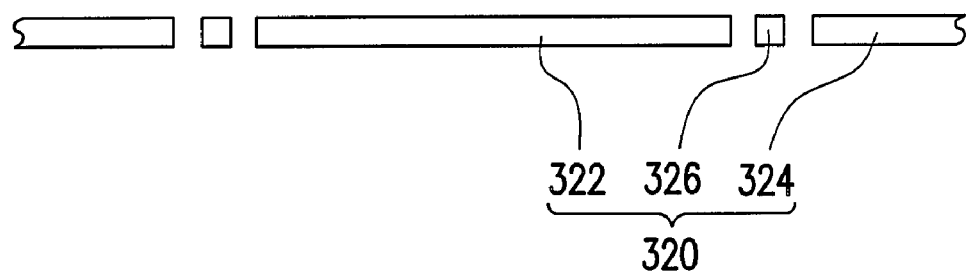
Figure 5B:
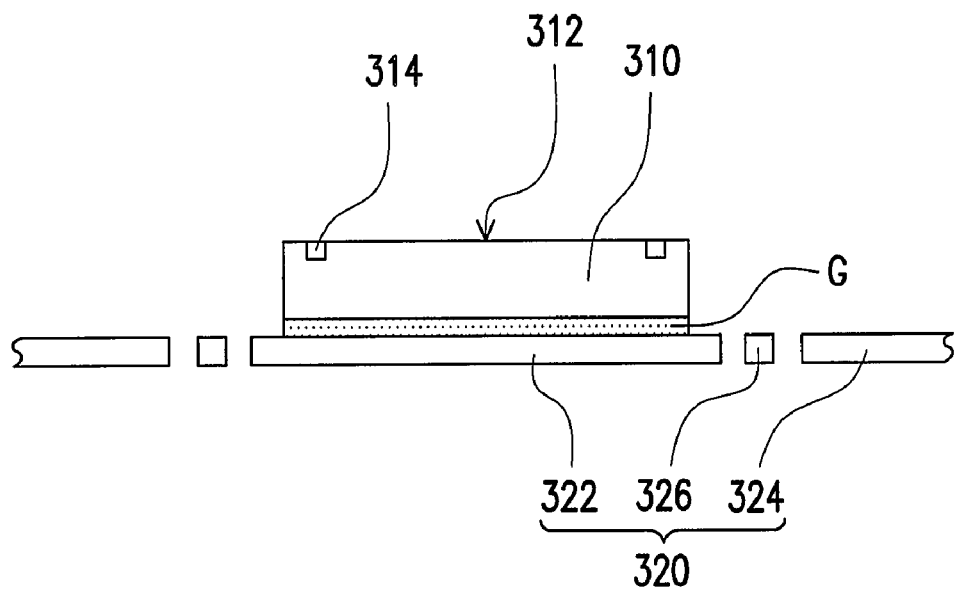
Figure 5C:
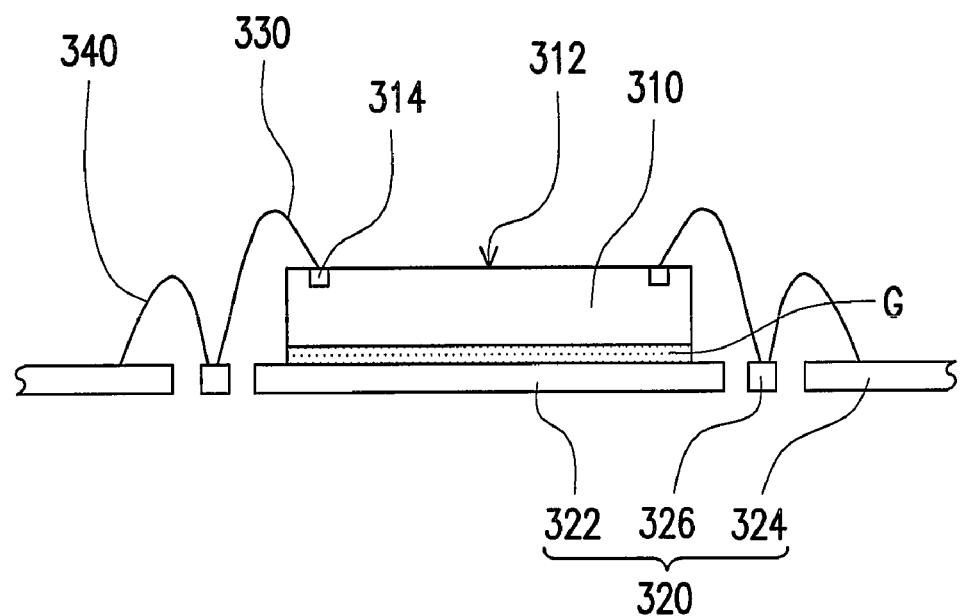
Figure 5D:
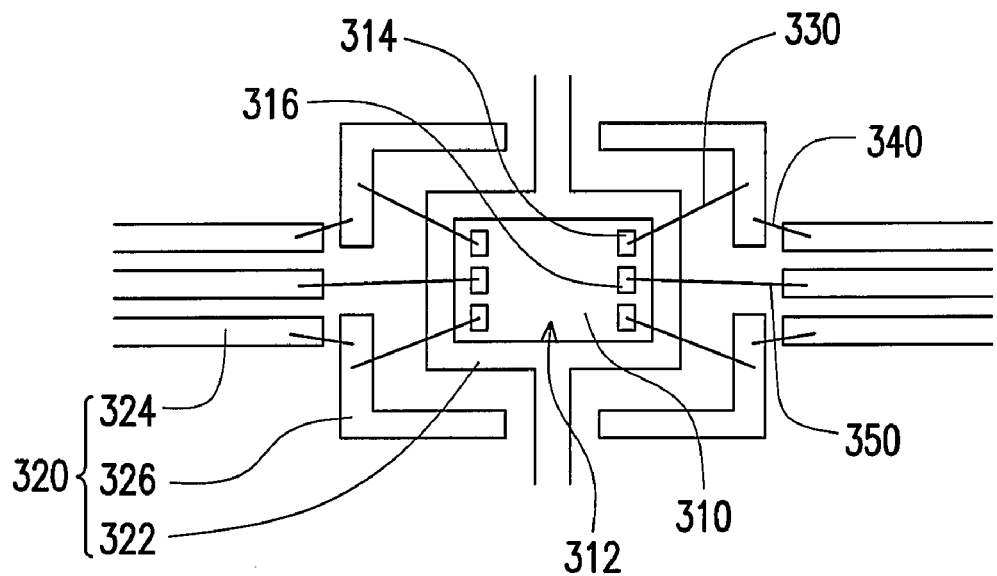

Afterward, referring to FIG. 5C, a wire bonding process is performed to form a plurality of first bonding wires 330, so as to respectively connect the first bonding pads 314 and the bus bars 326. A plurality of second bonding wires 340 is then formed to respectively connect the bus bars 326 and a part of the inner leads 324. Continuing to FIG. 5D, a plurality of third bonding wires 350 is then formed to respectively connect the second bonding pads 316 and the other of the inner leads 324.

Figure 5E:
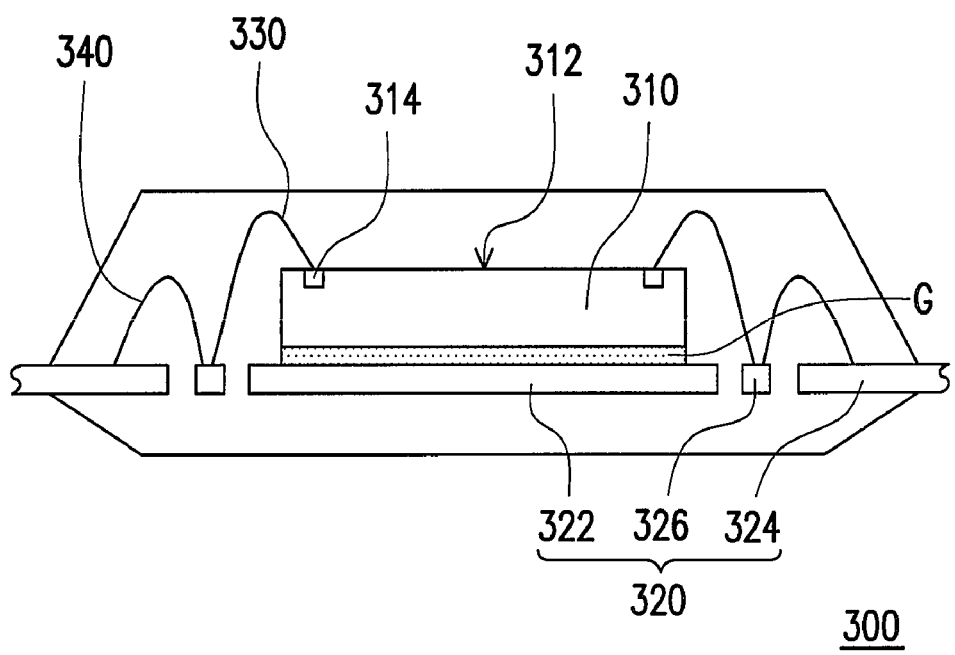

Referring to FIG. 5E, in the second embodiment, the method of fabricating the chip package structure 300 further includes forming an encapsulant 360 to cover the active surface 312, the die pad 322, the inner leads 324, the bus bars 326, the first bonding wires 330, the second bonding wires 340 and the third bonding wires 350. The chip package structure 300 of the second embodiment is achieved through the above steps.

In view of the above, the chip package structure and the fabricating method thereof in the present invention at least have the following advantages.

1. Since the first bonding pads are used as ground bonding pads, power supply bonding pads or signal bonding pads, and the bus bars are segmented, as a result, the number of the first bonding pads used as transfer points for electrically connecting the bus bars is increased, and the types (ground, power supply and signal bonding pads) can be various.

2. As the number of the first bonding pads used as transfer points for electrically connecting the bus bars is increased, therefore, the quantity of the third bonding wires directly connecting the second bonding pads and the other of the inner leads is reduced; the possibility of electric shorts caused by the collapse of the third bonding wires or the possibility of electric broken circuits caused by the breaking of the third bonding wires being pulled apart by the injected encapsulant during the molding process is reduced; thereby improving the product yield of the chip package structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
    a chip, having an active surface, a plurality of first bonding pads and a plurality of second bonding pads, wherein the first bonding pads and the second bonding pads are disposed on the active surface;
a lead frame, the chip is fixed below the lead frame, wherein the lead frame comprising:
  a plurality of inner leads;
  a plurality of bus bars, wherein the inner leads and the bus bars are disposed above the active surface of the chip, and the bus bars are located at the corners of the active surface;
a plurality of first bonding wires, respectively connecting the first bonding pads and the bus bars;
a plurality of second bonding wires, respectively connecting the bus bars and a part of the inner leads; and
a plurality of third bonding wires, respectively connecting the second bonding pads and the other of the inner leads.

2. The chip package structure as claimed in claim 1, further comprising an encapsulant to cover the active surface, the inner leads, the bus bars, the first bonding wires, the second bonding wires and the third bonding wires.

3. A chip package structure, comprising:
a chip, having an active surface, a plurality of first bonding pads and a plurality of second bonding pads, wherein the first bonding pads and the second bonding pads are disposed on the active surface;
a lead frame, comprising:
  a die pad, wherein the chip is disposed on the die pad, and the active surface is away from the die pad,
  a plurality of inner leads;
  a plurality of bus bars, disposed between the die pad and the inner leads, and the bus bars are located at the outer region of the corners of the die pad;
a plurality of first bonding wires, respectively connecting the first bonding pads and the bus bars;
a plurality of second bonding wires, respectively connecting the bus bars and a part of the inner leads; and
a plurality of third bonding wires, respectively connecting the second bonding pads and the other of the inner leads, wherein a vertical projection of the third bonding wires on the lead frame is isolated from the bus bars.

4. The chip package structure as claimed in claim 3, further comprising an encapsulant to cover the active surface, the die pad, the inner leads, the bus bars, the first bonding wires, the second bonding wires and the third bonding wires.

5. A fabricating method of a chip package structure, comprising:
providing a lead frame, the lead frame comprising a plurality of inner leads and a plurality of bus bars;
providing a chip, the chip having an active surface, a plurality of first bonding pads and a plurality of second bonding pads, wherein the first bonding pads and the second bonding pads are disposed on the active surface;
fixing the chip below the lead frame, so that the inner leads and the bus bars are disposed above the active surface of the chip, and the bus bars are located at the corners of the active surface;
forming a plurality of first bonding wires to respectively connect the first bonding pads and the bus bars;
forming a plurality of second bonding wires to respectively connect the bus bars and a part of the inner leads; and
forming a plurality of third bonding wires to respectively connect the second bonding pads and the other of the inner leads.

6. The fabricating method of a chip package structure as claimed in claim 5, further comprising an encapsulant to cover the active surface, the inner leads, the bus bars, the first bonding wires, the second bonding wires and the third bonding wires.

7. A fabricating method of a chip package structure, comprising:
providing a lead frame, the lead frame comprising a die pad, a plurality of inner leads and a plurality of bus bars, wherein the bus bars are disposed between the die pad and the inner leads, and the bus bars are located at the outer region of the corners of the die pad;
providing a chip, the chip having an active surface, a plurality of first bonding pads and a plurality of second bonding pads, wherein the first bonding pads and the second bonding pads are disposed on the active surface;
fixing the chip on the die pad, wherein the active surface is away from the die pad;
forming a plurality of first bonding wires to respectively connect the first bonding pads and the bus bars;
forming a plurality of second bonding wires to respectively connect the bus bars and a part of the inner leads; and
forming a plurality of third bonding wires to respectively connect the second bonding pads and the other of the inner leads, wherein a vertical projection of the third bonding wires on the lead frame is isolated from the bus bars.

8. The fabricating method of the chip package structure as claimed in claim 7, further comprising an encapsulant to cover the active surface, the die pad, the inner leads, the bus bars, the first bonding wires, the second bonding wires and the third bonding wires.

* * * * *